(12) United States Patent
Kim et al.

(10) Patent No.: US 12,322,577 B2
(45) Date of Patent: Jun. 3, 2025

(54) PLASMA BAFFLE, SUBSTRATE PROCESSING APPARATUS INCLUDING THE SAME, AND SUBSTRATE PROCESSING METHOD USING THE SAME

(71) Applicant: Samsung Electronics Co., Ltd., Suwon-si (KR)

(72) Inventors: Hakyoung Kim, Bucheon-si (KR); Dowon Kim, Jecheon-si (KR); Jisoo Im, Seongnam-si (KR); Youngjin Noh, Ansan-si (KR); Chulwoo Park, Suwon-si (KR); Minyoung Hur, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 101 days.

(21) Appl. No.: 17/963,704

(22) Filed: Oct. 11, 2022

(65) Prior Publication Data
US 2023/0245864 A1 Aug. 3, 2023

(30) Foreign Application Priority Data
Jan. 28, 2022 (KR) .................. 10-2022-0013339

(51) Int. Cl.
H01J 37/32 (2006.01)
(52) U.S. Cl.
CPC .. H01J 37/32633 (2013.01); H01J 37/32642 (2013.01); *H01J 2237/334* (2013.01)

(58) Field of Classification Search
CPC .......... H01J 37/32633; H01J 37/32642; H01J 37/32623; H01J 2237/334
See application file for complete search history.

(56) References Cited

U.S. PATENT DOCUMENTS

| 6,583,064 | B2 | 6/2003 | Wicker et al. |
| 8,083,891 | B2 | 12/2011 | Sato |
| 8,440,019 | B2 | 5/2013 | Carducci et al. |
| 11,101,114 | B2 | 8/2021 | Hosaka et al. |
| 2005/0224179 | A1* | 10/2005 | Moon ............... H01J 37/32834 156/345.29 |
| 2009/0206055 | A1 | 8/2009 | Sato et al. |

(Continued)

FOREIGN PATENT DOCUMENTS

| CN | 103021778 B | 9/2015 |
| JP | 2927211 B2 | 7/1999 |

(Continued)

*Primary Examiner* — Yuechuan Yu
(74) *Attorney, Agent, or Firm* — Muir Patent Law, PLLC

(57) ABSTRACT

Disclosed are plasma baffles, substrate processing apparatuses, and substrate processing methods. The plasma baffle comprises a lower ring, an upper ring outside the lower ring in a plan view and extending vertically, and an intermediate ring that extends from the lower ring to the upper ring to form an acute angle with respect to a horizontal direction. The lower ring includes a lower central hole that vertically penetrates a center of the lower ring, and a plurality of lower slits outside the lower central hole and vertically penetrating the lower ring. The intermediate ring provides an intermediate slit that connects an inner lateral surface of the intermediate ring to an outer lateral surface of the intermediate ring. An area ratio of the plurality of lower slits to the lower ring is equal to or greater than about 59%.

11 Claims, 15 Drawing Sheets

(56) References Cited

U.S. PATENT DOCUMENTS

| | | | |
|---|---|---|---|
| 2009/0218043 A1 | 9/2009 | Balakrishna et al. | |
| 2009/0250169 A1* | 10/2009 | Carducci | H01J 37/32495 |
| | | | 156/345.1 |
| 2017/0221682 A1 | 8/2017 | Nishimura et al. | |
| 2020/0066493 A1 | 2/2020 | Noorbakhsh et al. | |

FOREIGN PATENT DOCUMENTS

| | | | |
|---|---|---|---|
| KR | 10-2010-0128312 A | 12/2010 |
| KR | 10-2012-0074877 A | 7/2012 |
| KR | 10-2017-0070006 A | 6/2017 |
| KR | 10-2018-0014900 A | 2/2018 |
| KR | 10-2281472 B1 | 7/2021 |

* cited by examiner

US 12,322,577 B2

PLASMA BAFFLE, SUBSTRATE PROCESSING APPARATUS INCLUDING THE SAME, AND SUBSTRATE PROCESSING METHOD USING THE SAME

CROSS-REFERENCE TO RELATED APPLICATION

This U.S. nonprovisional application claims priority under 35 U.S.C § 119 to Korean Patent Application No. 10-2022-0013339 filed on Jan. 28, 2022 in the Korean Intellectual Property Office, the disclosure of which is hereby incorporated by reference in its entirety.

BACKGROUND

Some embodiments of the present inventive concepts relate to a plasma baffle, a substrate processing apparatus including the same, and a substrate processing method using the same, and more particularly, to a plasma baffle capable of increasing a flow rate to effectively remove foreign substances on a substrate, a substrate processing apparatus including the same, and a substrate processing method using the same.

A semiconductor device may be fabricated through various processes. For example, the semiconductor device may be manufactured by a photolithography process, an etching process, and a deposition process performed on a silicon wafer. Various fluids may be used in such processes. For example, plasma may be used in an etching process and/or a deposition process. It may be required to control a position of plasma during processes. A plasma baffle may be utilized to control plasma distribution and to discharge vapors.

SUMMARY

Some embodiments of the present inventive concepts provide a plasma baffle capable of removing foreign substances generated by processing a substrate, a substrate processing apparatus including the same, and a substrate processing method using the same.

Some embodiments of the present inventive concepts provide a plasma baffle capable of increasing an etching yield with respect to a substrate, a substrate processing apparatus including the same, and a substrate processing method using the same.

Some embodiments of the present inventive concepts provide a plasma baffle capable of increasing a movement speed of fluid while limiting plasma within a preferred area, a substrate processing apparatus including the same, and a substrate processing method using the same.

Some embodiments of the present inventive concepts provide a plasma baffle capable of independently controlling a flow rate in a circumferential direction, a substrate processing apparatus including the same, and a substrate processing method using the same.

The object of the present inventive concepts is not limited to the mentioned above, and other objects which have not been mentioned above will be clearly understood to those skilled in the art from the following description.

According to some embodiments of the present inventive concepts, a plasma baffle may comprise: a lower ring; an upper ring outside the lower ring in a plan view and extending vertically; and an intermediate ring that extends from the lower ring to the upper ring to form an acute angle with respect to a horizontal direction. The lower ring may include: a lower central hole that vertically penetrates a center of the lower ring; and a plurality of lower slits outside the lower central hole and vertically penetrating the lower ring. The intermediate ring may provide an intermediate slit that connects an inner lateral surface of the intermediate ring to an outer lateral surface of the intermediate ring. An area ratio of the plurality of lower slits to the lower ring may be equal to or greater than about 59%.

According to some embodiments of the present inventive concepts, a substrate processing apparatus may comprise: a stage; and a plasma baffle that surrounds the stage. The stage may include: a chuck configured to support a substrate; and a focus ring that surrounds the chuck. The plasma baffle may include: a lower ring; and an intermediate ring that outwardly extends from an edge of the lower ring to form an acute angle with respect to a horizontal direction. The lower ring may include: a lower central hole that vertically penetrates a center of the lower ring; and a lower slit outside the lower central hole and vertically penetrating the lower ring. The intermediate ring may provide an intermediate slit that connects an inner lateral surface of the intermediate ring to an outer lateral surface of the intermediate ring. A length of the lower slit may be greater than a length of the intermediate slit. A width of the lower slit may be the same as a width of the intermediate slit.

According to some embodiments of the present inventive concepts, a substrate processing method may comprise: placing a substrate into a substrate processing apparatus; performing an etching process on the substrate in the substrate processing apparatus; discharging a fluid from the substrate processing apparatus; and performing a deposition process on the substrate in the substrate processing apparatus. The step of performing the etching process on the substrate may include: supplying the substrate processing apparatus with a first process gas; and applying a first radio-frequency (RF) power to a chuck of the substrate processing apparatus. The step of supplying the substrate processing apparatus with the first process gas may include allowing a portion of the first process gas to escape through a plasma baffle that surrounds the chuck. The plasma baffle may include: a lower ring; and an intermediate ring that outwardly extends from an edge of the lower ring to form an acute angle with respect to a horizontal direction. The lower ring may provide a lower slit that vertically penetrates the lower ring and extends in a radial direction. The intermediate ring may provide an intermediate slit that connects an inner lateral surface of the intermediate ring to an outer lateral surface of the intermediate ring. A ratio of length to width of the lower slit may be in a range of about 9 to about 16. The length may be measured in the radial direction. The width may be measured in a circumferential direction.

Details of other example embodiments are included in the description and drawings.

DETAILED DESCRIPTION OF EMBODIMENTS

Figure 1:
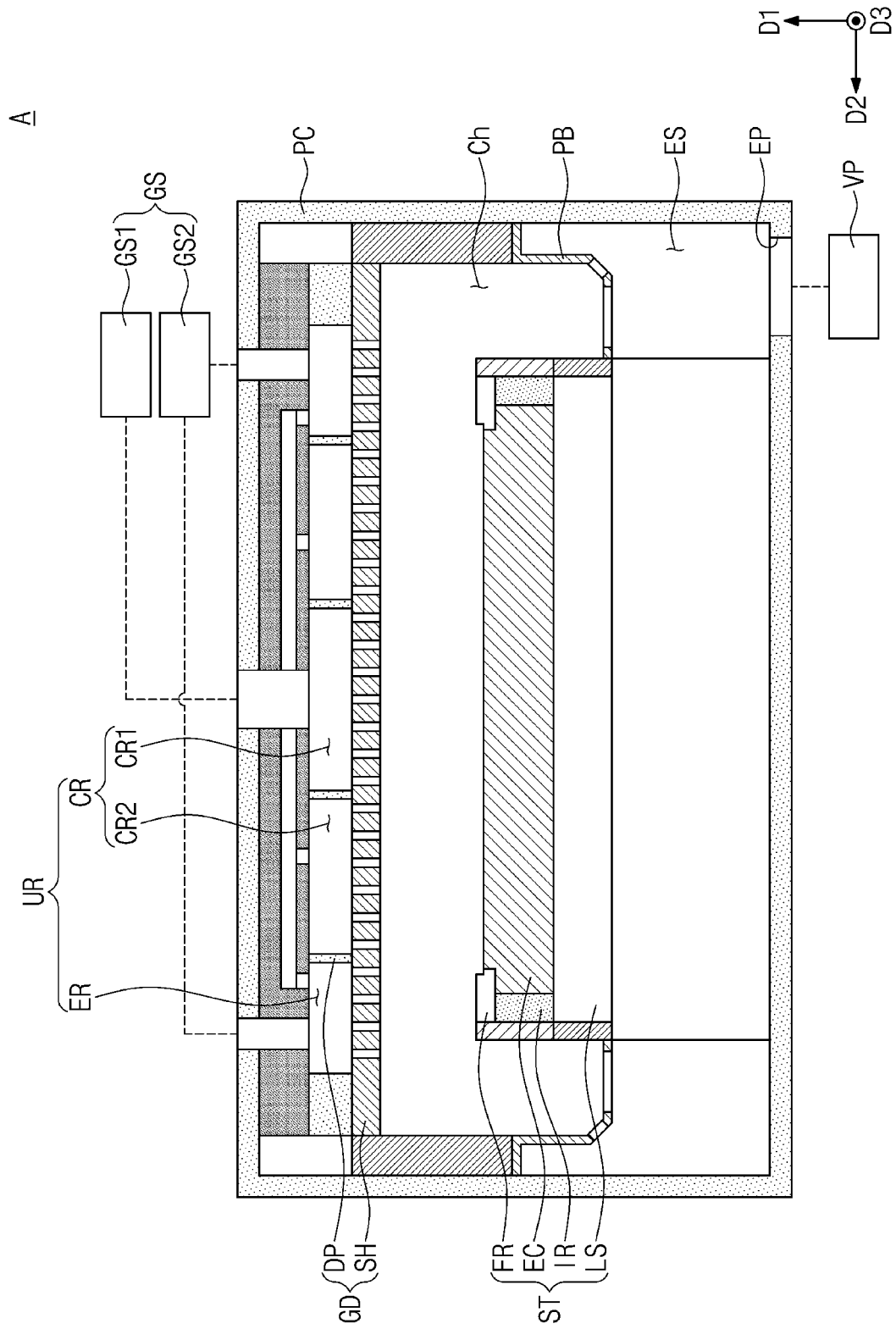
FIG. 1 illustrates a cross-sectional view showing a substrate processing apparatus according to some embodiments of the present inventive concepts.

The following will now describe some embodiments of the present inventive concepts with reference to the accompanying drawings. Like reference numerals may indicate like components throughout the description. In the drawings, the size and relative sizes of layers and regions may be exaggerated for clarity. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration. The language of the claims should be referenced in determining the requirements of the invention.

FIG. 1 illustrates a cross-sectional view showing a substrate processing apparatus according to some embodiments of the present inventive concepts.

In this description, symbol D1 may indicate a first direction, symbol D2 may indicate a second direction that intersects the first direction D1, and symbol D3 may indicate a third direction that intersects each of the first and second directions D1 and D2. The first direction D1 may be called a vertical direction. Each of the second and third directions D2 and D3 may be called a horizontal direction. For example, the first, second, and third directions D1, D2 and D3 may be perpendicular to each other.

Referring to FIG. 1, a substrate processing apparatus A may be provided. The substrate processing apparatus A may be a device that uses plasma to process a substrate. The substrate may include or may be a silicon (Si) wafer, but the present inventive concepts are not limited thereto. The substrate processing apparatus A may be configured such that the plasma is used to perform an etching process and/or a deposition process on the substrate. For example, the substrate processing apparatus A may perform a Bosch process in which the plasma is used to repeatedly execute etching and deposition processes on the substrate. For example, etching processes and deposition processes may be alternately and repeatedly performed in the substrate processing apparatus A on a substrate. In certain embodiments, etching processes and deposition processes may be alternately and repeatedly performed in the substrate processing apparatus A on multiple substrates sequentially.

The substrate processing apparatus A may use various ways to generate the plasma. For example, the substrate processing apparatus A may generate the plasma by using a capacitively coupled plasma (CCP) mode, an inductively coupled plasma (ICP) mode, or a magnetically enhanced reactive ion etching (MERLE) mode. The present inventive concepts, however, are not limited thereto, and the substrate processing apparatus A may use other ways to generate the plasma so as to perform a process on the substrate. For convenience, the following will describe the substrate processing apparatus A operated in the capacitively coupled plasma (CCP) mode.

The substrate processing apparatus A may include a process chamber PC, a gas supply unit GS, a gas distribution unit GD, a stage ST, a plasma baffle PB, and a vacuum pump VP.

The process chamber PC may provide a process space Ch. The process chamber PC may be connected to the gas supply unit GS to receive a process gas from the gas supply unit GS. The process chamber PC may be connected to the vacuum pump VP. A fluid, such as a process gas, in the process space Ch may be discharged toward the vacuum pump VP. The process chamber PC may provide an exhaust port EP. The process space Ch may be connected through the exhaust port EP to the vacuum pump VP. The exhaust port EP may be positioned biased towards one side in the process chamber PC. For example, the exhaust port EP may be positioned between a center of the process chamber PC and a side wall of the process chamber PC, e.g., in a plan view. For example, the exhaust port EP may be positioned biased towards a right-side based on FIG. 1. The stage ST and the plasma baffle PB may be disposed in the process chamber PC.

The gas supply unit GS may supply a process gas into the process space Ch. The gas supply unit GS may include a gas tank, a compressor, a pipe line, a controller, and so forth. The gas supply unit GS may supply many/various kinds of gases to the process chamber PC, e.g., at a time or sequentially. In certain embodiments, the gas supply unit GS may supply different gases to the process chamber PC at different times depending on a process performed in the process chamber PC. The gas supply unit GS may include a first gas supply unit GS1 and a second gas supply unit GS2. The first gas supply unit GS1 may supply a first process gas. The process space Ch may be supplied and completely filled with the first process gas. The second gas supply unit GS2 may supply a second process gas. The second process gas may include a gas whose kind is distinguished from that of the first process gas. The second process gas may be supplied to be biased towards one side in the process space Ch.

The gas distribution unit GD may be positioned in the process chamber PC. The gas distribution unit GD may distribute a process gas over the process space Ch. The gas distribution unit GD may include a showerhead SH and a gas separation plate DP. The showerhead SH may provide a plurality of gas supply holes. The showerhead SH may serve as an upper electrode. The showerhead SH may separate the process space Ch from a distribution space UR which is a space above the showerhead SH. For example, the showerhead SH may be positioned/interposed between the process space Ch and the distribution space UR in the process chamber PC. The distribution space UR may be divided into a central region CR and an edge region ER. For example, the gas separation plate DP may divide the central region CR and the edge region ER from each other. For example, a gas separation plate DP may be positioned/interposed between the central region CR and the edge region ER. The central region CR may be divided into a first central region CR1 and a second central region CR2. For example, another gas separation plate DP may be positioned/interposed between the first central region CR1 and the second central region CR2. The first process gas may be supplied to all of the first central region CR1, the second central region CR2, and the edge region ER. The second process gas may be supplied to only the edge region ER. For example, the second process gas may not be supplied to the first and second central regions CR1 and CR2 of the distribution space UR. A process gas supplied into the distribution space UR may move and be distributed to the process space Ch through the gas supply holes of the showerhead SH.

The stage ST may support a substrate. The stage ST may be positioned in the process chamber PC. The stage ST may include a chuck EC, a lower support LS, a focus ring FR, and an insulator ring IR.

The chuck EC may support a substrate. The chuck EC may use an electrostatic force to rigidly place a substrate in a specific position of the chuck EC, e.g., on an upper surface of the chuck EC. The chuck EC may include a chuck electrode. In addition, the chuck EC may be provided therein with a heater and/or a cooling passage. Moreover, the chuck EC may be provided therein with a plasma electrode (not shown) to which a radio-frequency (RF) power is applied, e.g., to generate a plasma in the process chamber Ch. Alternatively, the plasma electrode may be positioned beneath the electrostatic chuck EC. The lower support LS may support the chuck EC. The focus ring FR may surround the chuck EC. For example, when viewed in plan, the focus ring FR may surround a substrate disposed on the chuck EC, e.g., while the substrate is processed in the process chamber PC. The insulator ring IR may support the focus ring FR, and may surround the chuck EC.

The plasma baffle PB may surround the stage ST. For example, below the chuck EC, the plasma baffle PB may surround the stage ST. For example, the plasma baffle PB may surround the stage ST and may laterally overlap a portion of the stage ST lower than a portion that the chuck EC is placed. For example, the plasma baffle PB may not laterally overlap the chuck EC. The plasma baffle PB may be designed to control/manage a flow rate of the plasma and/or the process gas and/or a pressure in the process space Ch. The present inventive concepts, however, are not limited thereto, and at a height similar to that of the focus ring FR, the plasma baffle PB may surround the stage ST in certain embodiments. Alternatively, the plasma baffle PB may be located at a position higher than that of the focus ring FR. A space under the plasma baffle PB may be an exhaust space ES. The exhaust space ES may be connected to the exhaust port EP. The plasma baffle PB may allow a gas to pass from the process space Ch to the exhaust space ES. For example, a gas in the process space Ch may pass through the plasma baffle PB to the exhaust space ES, thereby being discharged from/through the exhaust port EP. The plasma may not be allowed to easily pass through the plasma baffle PB. For example, the plasma baffle PB may limit a position of the plasma. The plasma baffle PB may allow the plasma to concentrate on/above a substrate disposed on the stage ST. For example, the plasma baffle PB may be designed for the plasma to be concentrated above and in the vicinity of the substrate disposed on the stage ST. Therefore, the plasma baffle PB may be referred to as a confinement ring. The plasma baffle PB may be fixed to the stage ST and/or the process chamber PC. For example, the plasma baffle PB may be fixed to the process chamber PC through a bolt (not shown) or the like. The plasma baffle PB will be further discussed in detail below.

The vacuum pump VP may be connected to the process chamber PC. For example, the vacuum pump VP may be connected through the exhaust port EP to the process space Ch. The vacuum pump VP may draw (e.g., pump out) a fluid from the process space Ch. The vacuum pump VP may be positioned on one side below the process chamber PC. For exampl, the vacuum pump VP may vertically overlap the process chamber PC. The present inventive concepts, however, are not limited thereto, and the vacuum pump VP may be positioned on a lateral side of the process chamber PC. For example, the vacuum pump VP may be laterally overlap the process chamber PC.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 2:
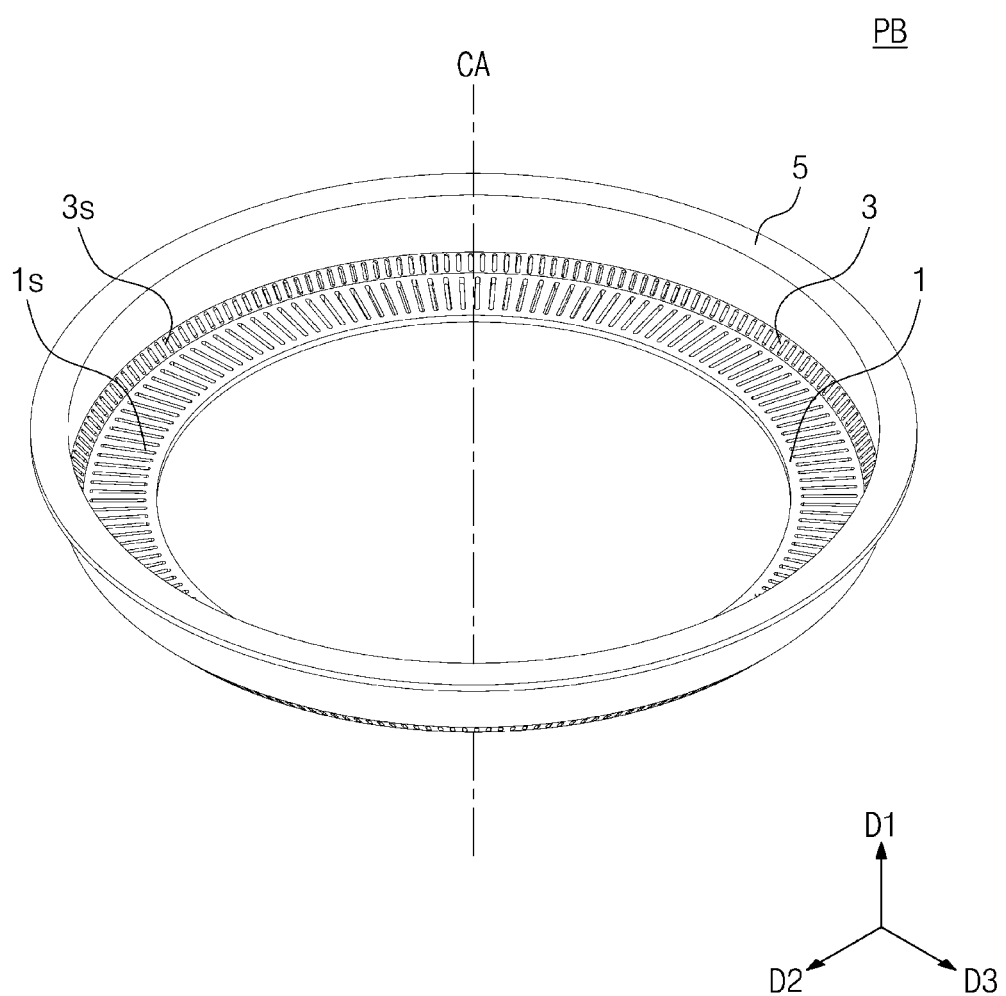
FIG. 2 illustrates a perspective view showing a plasma baffle according to some embodiments of the present inventive concepts.
Figure 3:
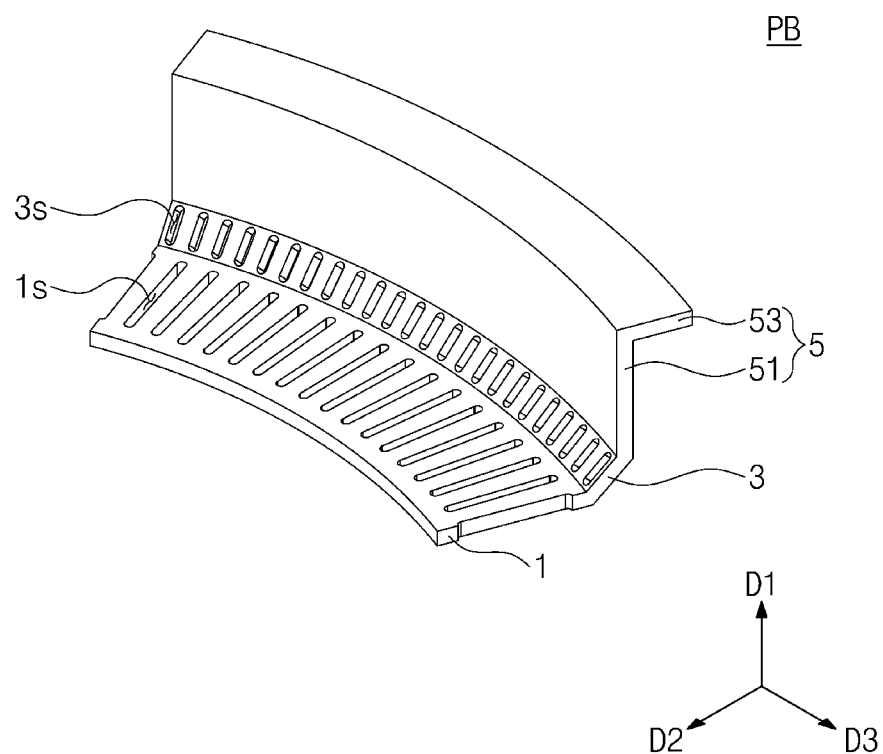
FIG. 3 illustrates an enlarged cutaway perspective view partially showing a plasma baffle according to some embodiments of the present inventive concepts.
Figure 4:
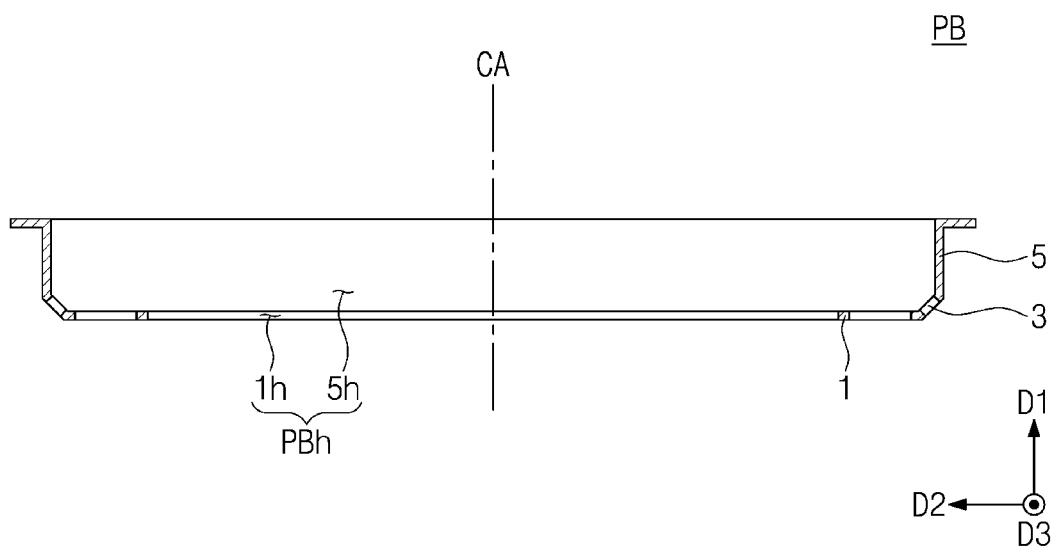
FIG. 4 illustrates a cross-sectional view showing a plasma baffle according to some embodiments of the present inventive concepts.

FIG. 2 illustrates a perspective view showing a plasma baffle according to some embodiments of the present inventive concepts. FIG. 3 illustrates an enlarged cutaway perspective view partially showing a plasma baffle according to some embodiments of the present inventive concepts. FIG. 4 illustrates a cross-sectional view showing a plasma baffle according to some embodiments of the present inventive concepts.

Referring to FIGS. 2 to 4, the plasma baffle PB may include a lower ring 1, an upper ring 5, and an intermediate ring 3.

Figure 5:
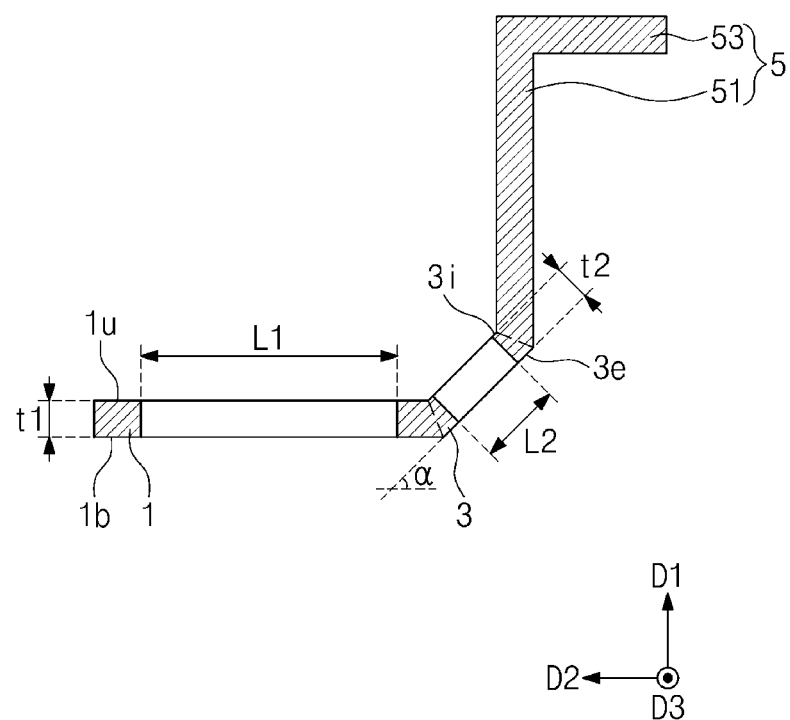
FIG. 5 illustrates an enlarged cross-sectional view showing a plasma baffle according to some embodiments of the present inventive concepts.
Figure 6:
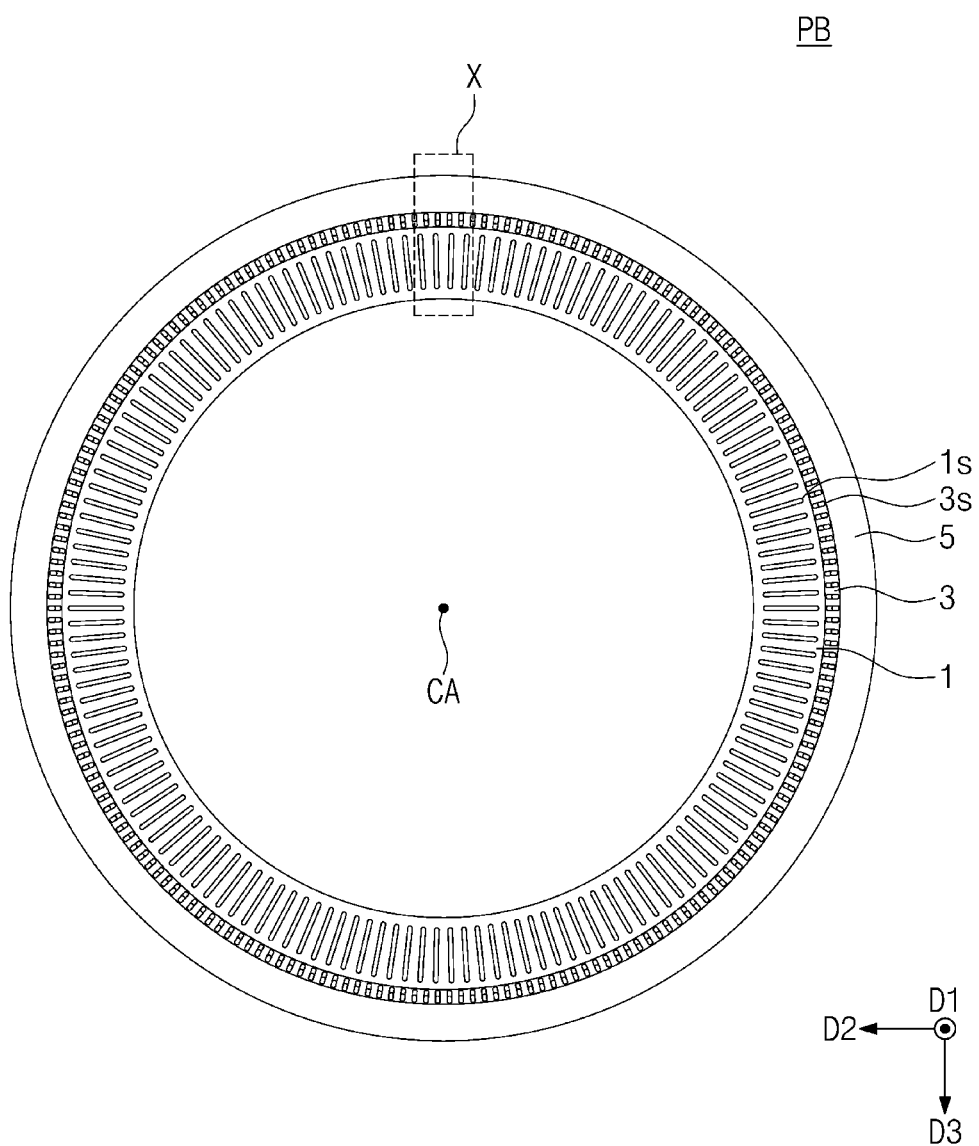
FIG. 6 illustrates a plan view showing a plasma baffle according to some embodiments of the present inventive concepts.

The lower ring 1 may be a rotation body with a central axis CA. For example, the lower ring 1 may have a rotational symmetry with respect to the central axis CA. The central axis CA may pass through a center point of the plasma baffle PB in a plan view. The lower ring 1 may be a portion of a disk. The lower ring 1 may provide a lower central hole 1h. The lower central hole 1h may vertically penetrate a center of the lower ring 1. The lower ring 1 may provide a lower slit 1s. The lower slit is may be positioned outside the lower central hole 1h. For example, outside the lower central hole 1h, the lower slit is may vertically penetrate the lower ring 1. The lower slit 1s may extend a certain length in a radial direction. With reference to FIGS. 5 and 6, the following will describe in detail a length of the lower slit 1s. A plurality of lower slits is may be provided in the lower ring 1. For example, there may be provided about 300 lower slits is in the lower ring 1. The plurality of lower slits is may be spaced apart from each other in a circumferential direction. For example, the lower ring 1 may have a disk shape having the lower central hole and the plurality of lower slits 1s in it. An area ratio of the plurality of lower slits 1s to the lower ring 1 may affect the flow rate of the process gas and/or the foreign substance. Therefore, the lower slits may be designed for the area ratio to have a certain proper value. For example, the area ratio of the plurality of lower slits is to the lower ring 1 may be equal to or greater than about 59%. For example, the ratio of the plurality of lower slits is to the lower ring 1 may be in a range from about 59.85% to about 70%. As discussed above, the plurality of lower slits 1s may occupy an area of the lower ring 1 to properly control the process preformed in the process chamber PC. In this case, a fluid may be satisfactorily/properly discharged through the lower slit 1s. When the area ratio of the plurality of lower slits is to the lower ring 1 is equal to or greater than about 59%, a process fluid may be favorably escaped through the lower slit 1s. In this description, a single lower slit 1s is mainly discussed as an example unless otherwise noted. The single lower slit 1s may represent each of the lower slits is unless otherwise noted.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The upper ring 5 may be disposed outside the lower ring 1. For example, the upper ring 5 may be disposed farther than the lower ring 1 with respect to the center point of the plasma baffle BP, e.g., in a plan view. For example, the upper ring 5 may have an inside diameter greater than an outside diameter of the lower ring 1. The upper ring 5 may be disposed at a higher level than the lower ring 1. For example, the lowest portion of the upper ring 5 may be disposed higher than the highest portion of the lower ring 1. The upper ring 5 may extend vertically. The upper ring 5 may be connected through the intermediate ring 3 to the lower ring 1. For example, the lower, intermediate, and upper rings 1, 3, and 5 may be integrally formed as one body. In certain embodiments, the lower, intermediate, and upper rings 1, 3, and 5 may not be formed as one body but be airtightly assembled together. The upper ring 5 may include an upper ring body 51 and an upper connection member 53. The upper ring body 51 may upwardly extend from the intermediate ring 3. The upper ring body 51 may have a hollow cylindrical shape. The upper connection member 53 may be coupled to a top end of the upper ring body 51. The upper connection member 53 may outwardly extend from the top end of the upper ring body 51. The upper ring 5 may provide an upper central hole 5h. The upper central hole 5h may vertically penetrate a center of the upper ring 5. The upper central hole 5h may be spatially connected to the lower central hole 1h. A combination of the upper central hole 5h and the lower central hole 1h may be called a baffle central hole PBh.

Figure 7:
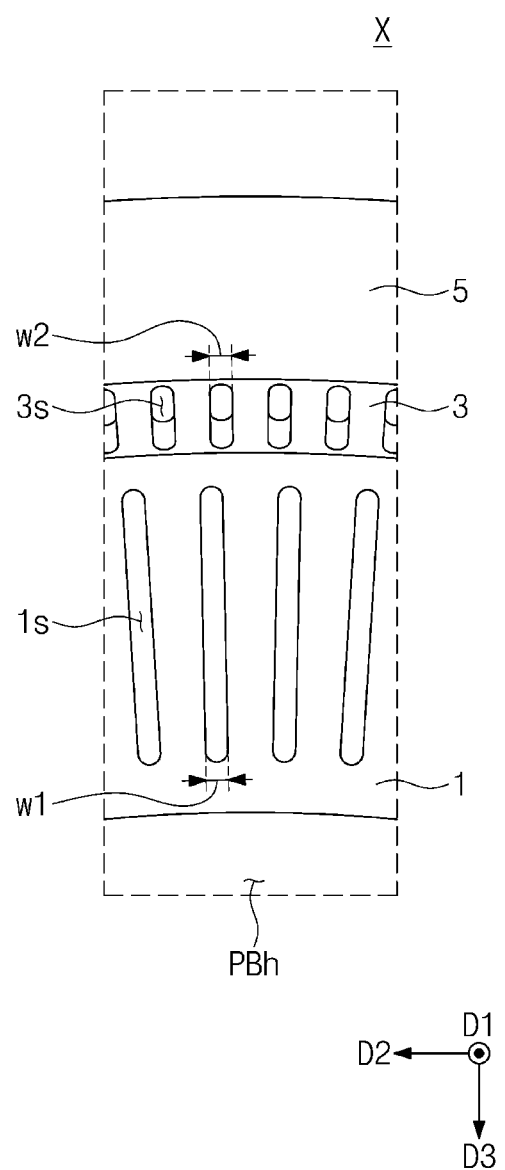
FIG. 7 illustrates an enlarged plan view showing section X of FIG. 6.

The intermediate ring 3 may outwardly extend from an edge of the lower ring 1 to form an acute angle with respect to a horizontal direction. For example, the intermediate ring 3 may obliquely extend. The intermediate ring 3 may extend from the edge of the lower ring 1 to connect to the upper ring 5. The intermediate ring 3 may provide an intermediate slit 3s. The intermediate slit 3s may penetrate the intermediate ring 3. For example, the intermediate slit 3s may penetrate the intermediate ring 3 to connect the inner and outer lateral surfaces of the intermediate ring 3 to each other. The intermediate slit 3s may extend along an extending direction of the intermediate ring 3. With reference to FIGS. 5 and 7, the following will describe in detail a shape of the intermediate slit 3s. A plurality of intermediate slits 3s may be provided in the intermediate ring 3. The number of the intermediate slit 3s may be greater than that of the lower slit 1s. For example, the number of the intermediate slit 3s may be greater than that of the lower slit 1s by about 10% or more. For example, there may be about 400 intermediate slits 3s. The plurality of intermediate slits 3s may be disposed spaced apart from each other in a circumferential direction. In this description, a single intermediate slit 3s is mainly discussed as an example unless otherwise noted. The single intermediate slit 3s may represent each of the intermediate slits 3s unless otherwise noted.

FIG. 5 illustrates an enlarged cross-sectional view showing a plasma baffle according to some embodiments of the present inventive concepts.

Referring to FIG. 5, the lower slit 1s may vertically penetrate the lower ring 1 to connect a top surface 1u of the lower ring 1 to a bottom surface 1b of the lower ring 1. For example, the lower slit is may extend from the top surface 1u of the lower ring 1 to the bottom surface 1b of the lower ring 1. A first thickness t1 may be given as a thickness of the lower slit 1s. For example, the lower slit 1s may have the first thickness t1. The first thickness t1 may be substantially identical or similar to a thickness of the lower ring 1, but the present inventive concepts are not limited thereto.

Terms such as "same," "equal," "planar," "identical," or "coplanar," as used herein encompass identicality or near identicality including variations that may occur, for example, due to manufacturing processes. The term "substantially" may be used herein to emphasize this meaning, unless the context or other statements indicate otherwise.

The lower slit is may extend in a radial direction. A first length L1 may be given as a length in a radial direction of the lower slit 1s. A detailed description thereof will be further discussed below.

The intermediate ring 3 may extend in an oblique direction with respect to a radial direction and with respect to a horizontal direction from the end of the lower ring 1. For example, the intermediate ring 3 may extend from the lower ring 1 toward/to the upper ring 5 to form an acute angle with respect to a horizontal direction. A first angle $\alpha$ may be formed between the intermediate ring 3 and a horizontal direction/line/surface. The first angle $\alpha$ may range from about 10° to about 80°. For example, the first angle may range from about 30° to about 60°.

The intermediate slit 3s may penetrate the intermediate ring 3 so as to connect an inner lateral surface 3i of the intermediate ring 3 to an outer lateral surface 3e of the intermediate ring 3. For example, the intermediate ring 3 may have two opposite surfaces of which one surface facing the central axis CA is the inner lateral surface 3i and the other surface opposite the inner lateral surface is the outer lateral surface 3e. The outer lateral surface 3e may face outside the plasma baffle PB. A second thickness t2 may be given as a thickness of the intermediate slit 3s. For example, each of the intermediate ring 3 and the intermediate slit 3s may have a thickness t2. The second thickness t2 may be a length of the intermediate slits 3s in a direction perpendicular to an extending direction of the intermediate ring 3, e.g., in a direction perpendicular to the lateral surfaces (e.g., exposing surfaces) of the intermediate ring 3. The second thickness t2 may be substantially identical or similar to the first thickness t1. A detailed description thereof will be further discussed below.

A second length L2 may be defined as a length of the intermediate slit 3s. For example, the intermediate slit may have the second length L2 in a lengthwise direction. The second length L2 may be a length of the intermediate slit 3s in an extending direction of the intermediate ring 3. The second length L2 may be less than the first length L1. The first length L1 may be greater than the second length L2.

FIG. 6 illustrates a plan view showing a plasma baffle according to some embodiments of the present inventive concepts. FIG. 7 illustrates an enlarged plan view showing section X of FIG. 6.

Referring to FIGS. 6 and 7, a first width w1 may be given as a width of the lower slit 1s. For example, the lower slit is may have the first width w1, e.g., in a direction perpendicular to the radial direction. The first width w1 may be a length in a circumferential direction of the lower slit 1s. The first width w1 may be equal to or less than about 4 mm. For example, the first width w1 may be in a range from about 1 mm to about 3 mm.

A second width w2 may be given as a width of the intermediate slit 3s. For example, the intermediate slit 3s may have the second widths w2. The second width w2 may be a length in a circumferential direction of the intermediate slit 3s. The second width w2 may be substantially identical or similar to the first width w1. For example, the second width w2 may be in a range from about 1 mm to about 3 mm.

Referring to FIGS. 5 and 7, the first thickness t1 or the thickness of the lower slit is may be the same as the second thickness t2 or the thickness of the intermediate slit 3s. In addition, the first width w1 or the width of the lower slit is may be the same as the second width w2 or the width of the intermediate slit 3s. Therefore, a ratio (w1/t1) of the width to thickness of the lower slit is may be the same as a ratio (w2/t2) of the width to thickness of the intermediate slit 3s. A ratio of width to thickness of a slit may be correlated to a limitation of plasma. For example, the ratio of width to thickness of the slits may affect the confinement of the plasma. Therefore, a proper ratio of width to thickness of the slits is preferable as proposed in the present disclosure. When the width-thickness ratio of the lower slit 1s is the same as the width-thickness ratio of the intermediate slit 3s, the degree of confinement of plasma at the lower slit 1s may be the same as the degree of confinement of plasma at the intermediate slit 3s. Accordingly, it may be possible to accomplish uniform confinement of plasma.

A length of slit may be correlated to an amount and/or rate of fluid that passes through the slit. For example, a length-width ratio of slit may affect variation in amount and/or rate of fluid that passes through the slit. For example, an increase in length of slit may increase in amount and/or rate of flow of fluid that passes through the slit.

A ratio (L1/w1) of the first length L1 to the first width w1 of the lower slit is may be in a range of about 9 to about 16. An amount and/or rate of flow of fluid that passes through the lower slit is may be appropriately controlled with the range mentioned above. For example, when the ratio (L1/w1) of the first length L1 to the first width w1 of the lower slit 1s is greater than about 16, an amount and/or rate of flow of fluid that passes through the lower slit 1s may be extraordinarily increased. In addition, when the ratio (L1/w1) of the first length L1 to the first width w1 of the lower slit 1s is less than about 9, an amount and/or rate of flow of fluid that passes through the lower slit is may be exceedingly decreased.

A ratio (L2/w2) of the second length L2 to the second width w2 of the intermediate slit 3s may be in a range of about 3.5 to about 5.5. An amount and/or rate of flow of fluid that passes through the intermediate slit 3s may be appropriately controlled with the range mentioned above.

As discussed above, when viewed in plan as illustrated in FIG. 6, the area ratio of the plurality of lower slits 1s to the lower ring 1 may be equal to or greater than about 59%. For example, an area of the lower slit is may range from about $3.0 \times 10^4$ mm$^2$ to about $9.0 \times 10^4$ mm$^2$. For example, the area of the lower slit is may range from about $6.0 \times 10^4$ mm$^2$ to about $7.0 \times 10^4$ mm$^2$. Within the value mentioned above, a fluid may satisfactorily pass through the lower slit 1s. The present inventive concepts, however, are not limited thereto.

Figure 8:
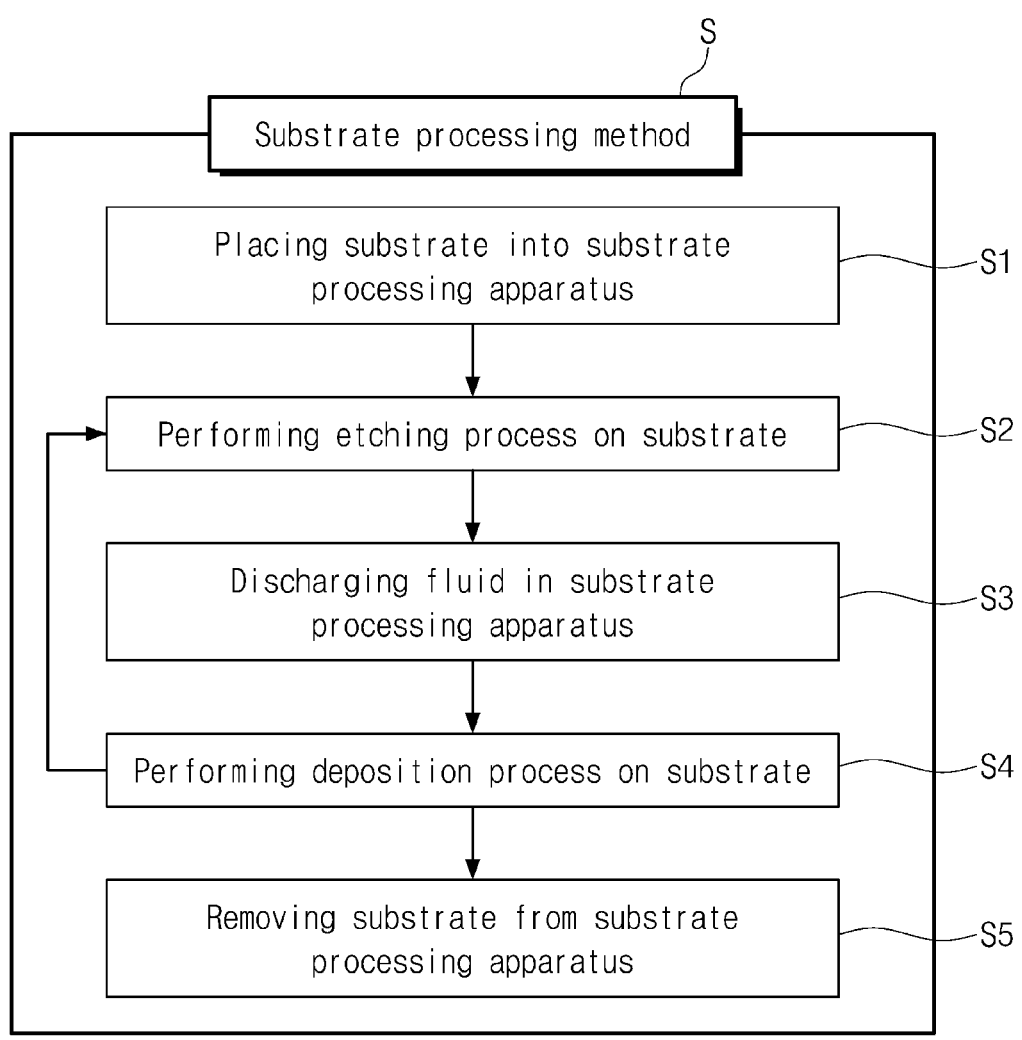
FIG. 8 illustrates a flow chart showing a substrate processing method according to some embodiments of the present inventive concepts.

FIG. 8 illustrates a flow chart showing a substrate processing method according to some embodiments of the present inventive concepts.

Referring to FIG. 8, a substrate processing method S may be provided. The substrate processing method S may be a method in which the substrate processing apparatus A discussed with reference to FIGS. 1 to 7 is used to perform a process on a substrate. The substrate processing method S may include a step S1 of loading a substrate into a substrate processing apparatus, a step S2 of performing an etching process on the substrate, a step S3 of discharging a fluid from the substrate processing apparatus, a step S4 of performing a deposition process on the substrate, and a step S5 of unloading the substrate from the substrate processing apparatus.

The substrate processing method S of FIG. 8 will be discussed below in detail with reference to FIGS. 9 to 15.

FIGS. 9 to 15 illustrate cross-sectional views showing a substrate processing method according to the flow chart of FIG. 8.

Figure 9:
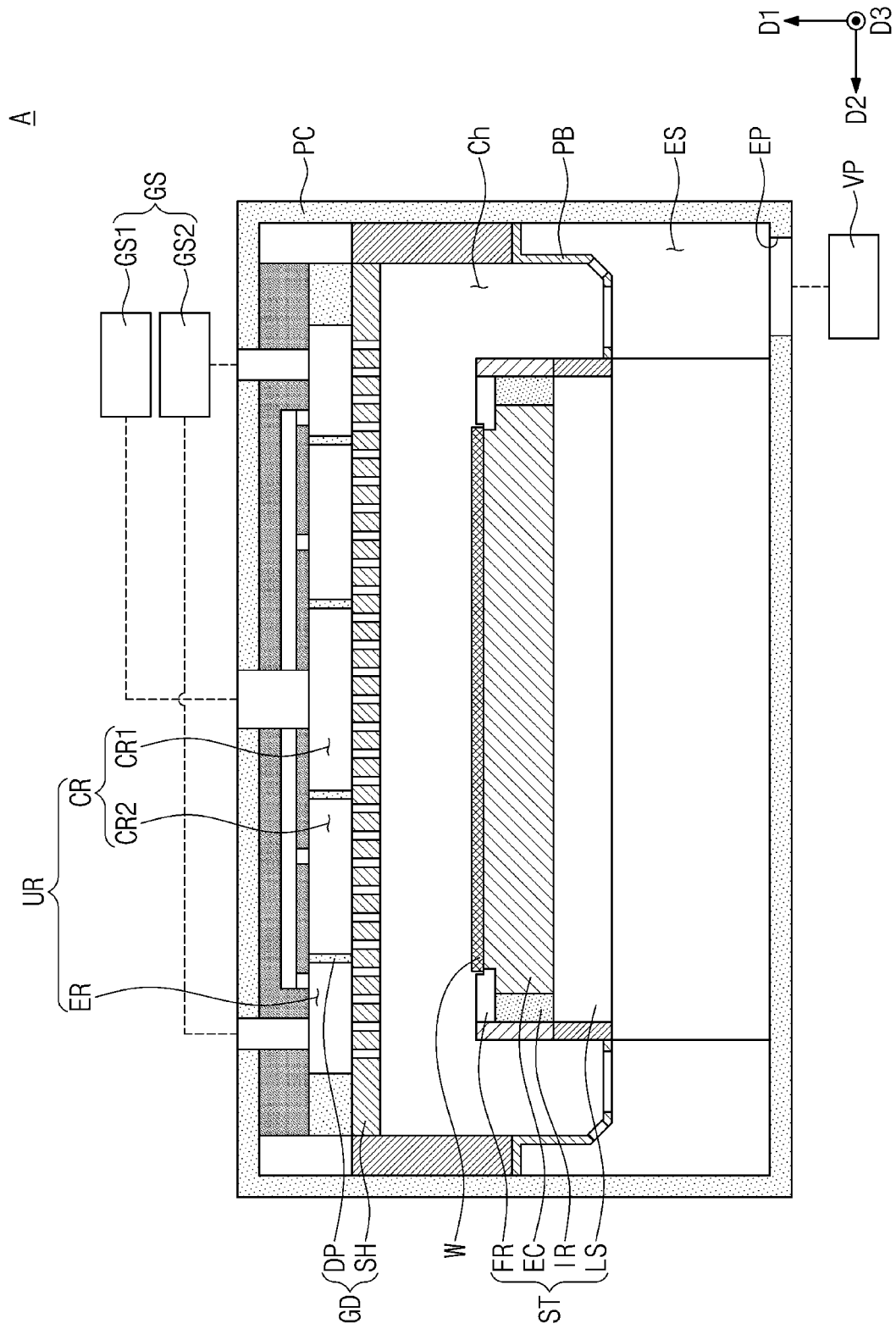
FIGS. 9 to 15 illustrate cross-sectional views showing a substrate processing method according to the flow chart of FIG. 8.

Referring to FIGS. 8 and 9, the substrate loading step S1 may include placing a substrate W onto the chuck EC. The substrate W may include or may be a silicon (Si) wafer, but the present inventive concepts are not limited thereto. The substrate W may be fixed onto the chuck EC. For example, the chuck EC may use an electrostatic force to hold or rigidly place the substrate W in a specific position on the chuck EC.

Figure 10:
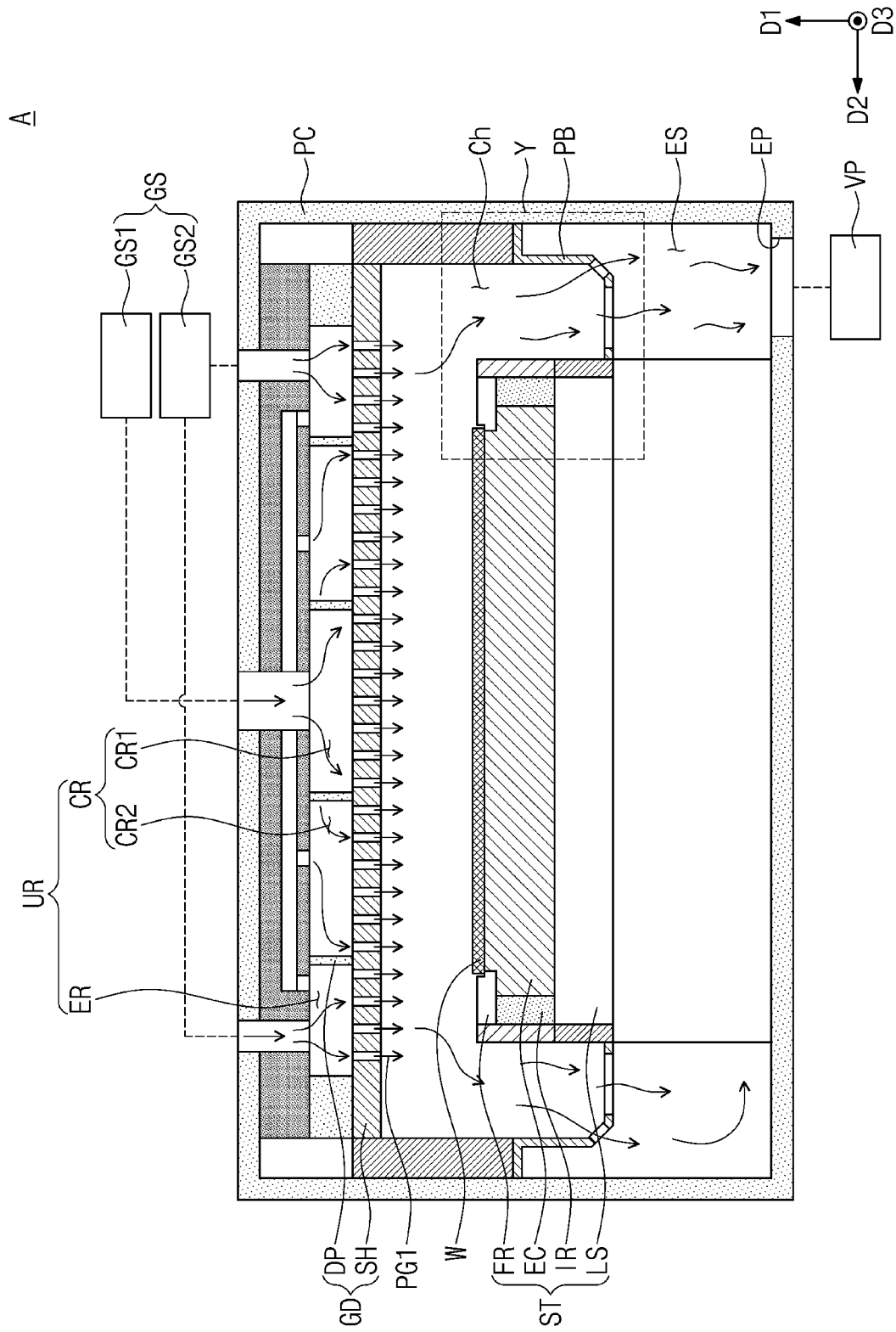
Figure 11:
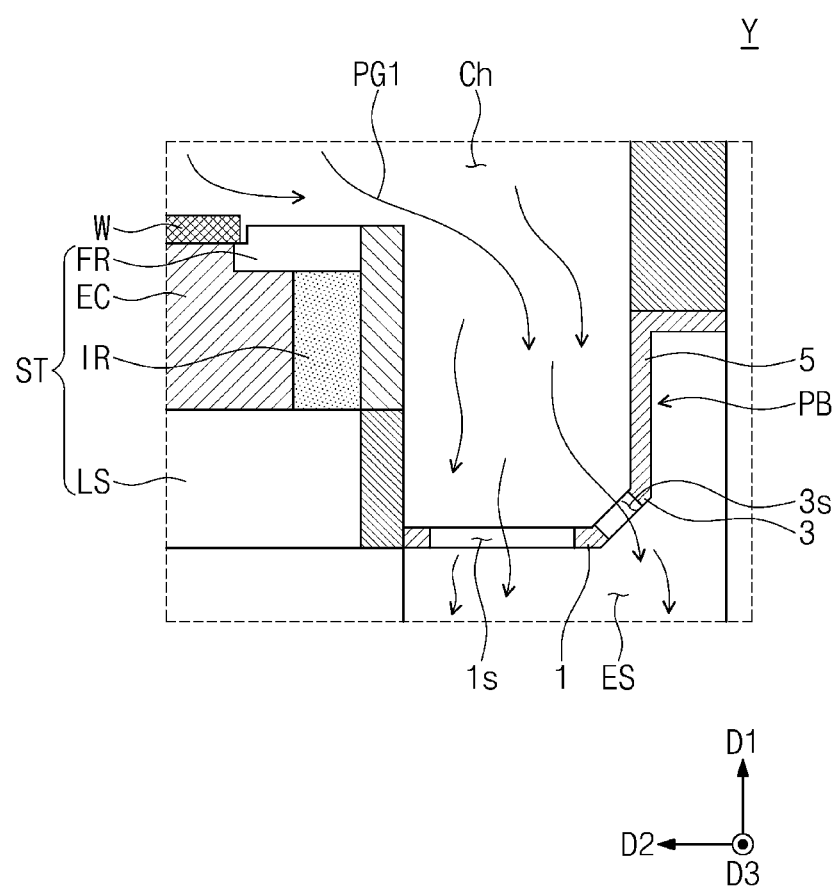

Referring to FIGS. 8, 10, and 11, the etching step S2 may include supplying the substrate processing apparatus A with a first process gas PG1. For example, the first process gas PG1 may be supplied from the gas supply unit GS through the distribution space UR and the showerhead SH, and may then be distributed to the process space Ch. The first process gas PG1 may be a fluid for an etching process. For example, the first process gas PG1 may partially etch a top surface of the substrate W. A portion of the first process gas PG1 distributed to/toward the substrate W may be escaped from the process space Ch to the exhaust space ES through the plasma baffle PB, as shown in FIGS. 10 and 11. For example, the etching step S2 may include allowing a portion of the first process gas PG1 to escape through the plasma baffle PB. For example, a portion of the first process gas PG1 may move from the process space Ch through one or more of the lower slits is and the intermediate slits 3s to the exhaust space ES. The process gas PG1 in the exhaust space ES may be outwardly discharged through the exhaust port EP. As the intermediate slit 3s forms an acute angle relative to a horizontal direction, the first process gas PG1 positioned on/over the substrate W may obliquely move downwards. In this case, the first process gas PG1 may be downwardly discharged while passing through a space on an edge region of the substrate W. The intermediate slits 3s formed obliquely with respect to horizontal direction and facing an edge area of a top surface of the stage ST is beneficial to discharging the process gas PG1 from over the substrate.

Figure 12:
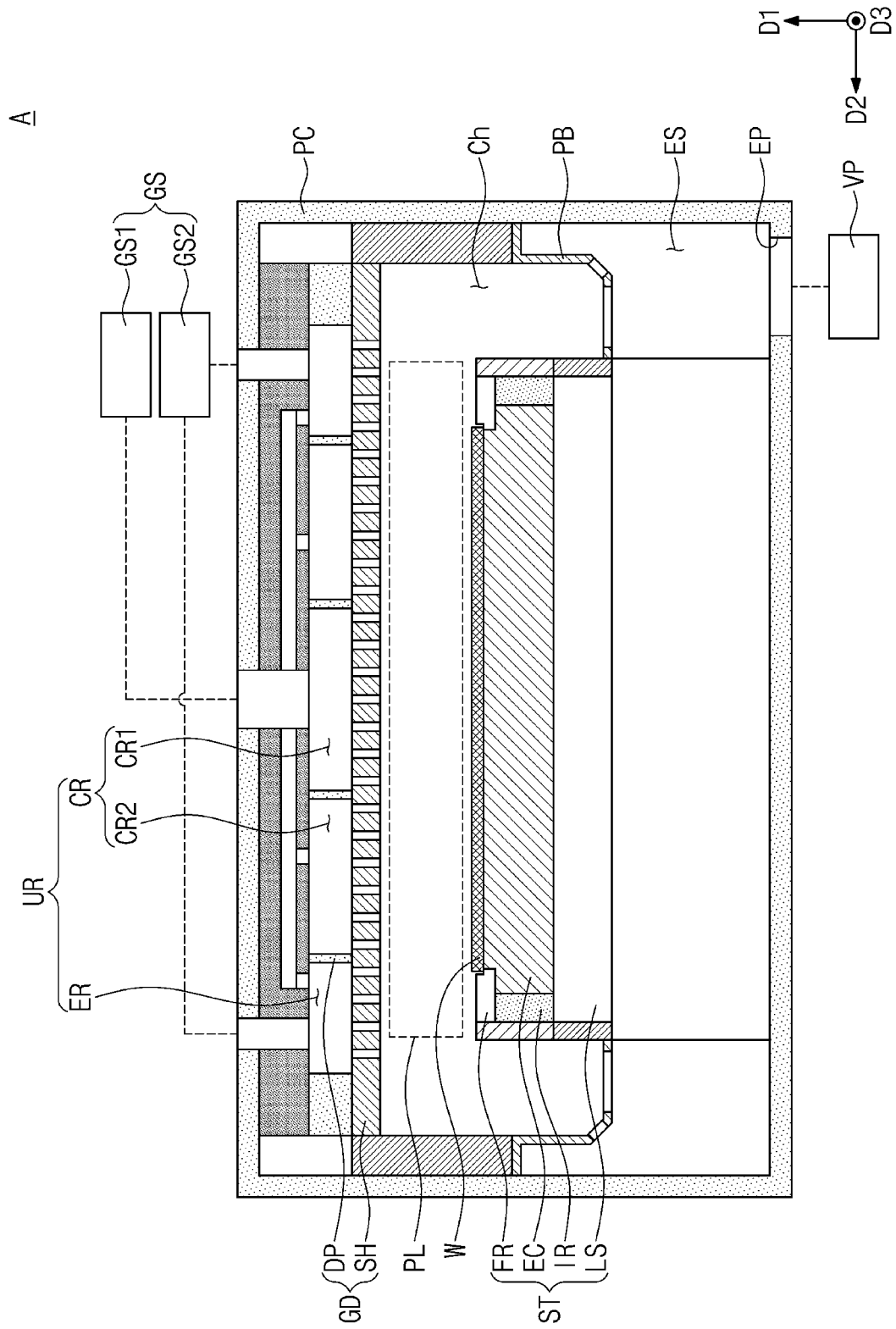

Referring to FIGS. 8 and 12, the etching step S2 may include applying a first radio-frequency (RF) power to the chuck EC. The first RF power applied to the chuck EC may convert a portion of the first process gas (see PG1 of FIG. 10) into plasma PL. An etching process on the substrate W may be performed with the plasma PL.

Figure 13:
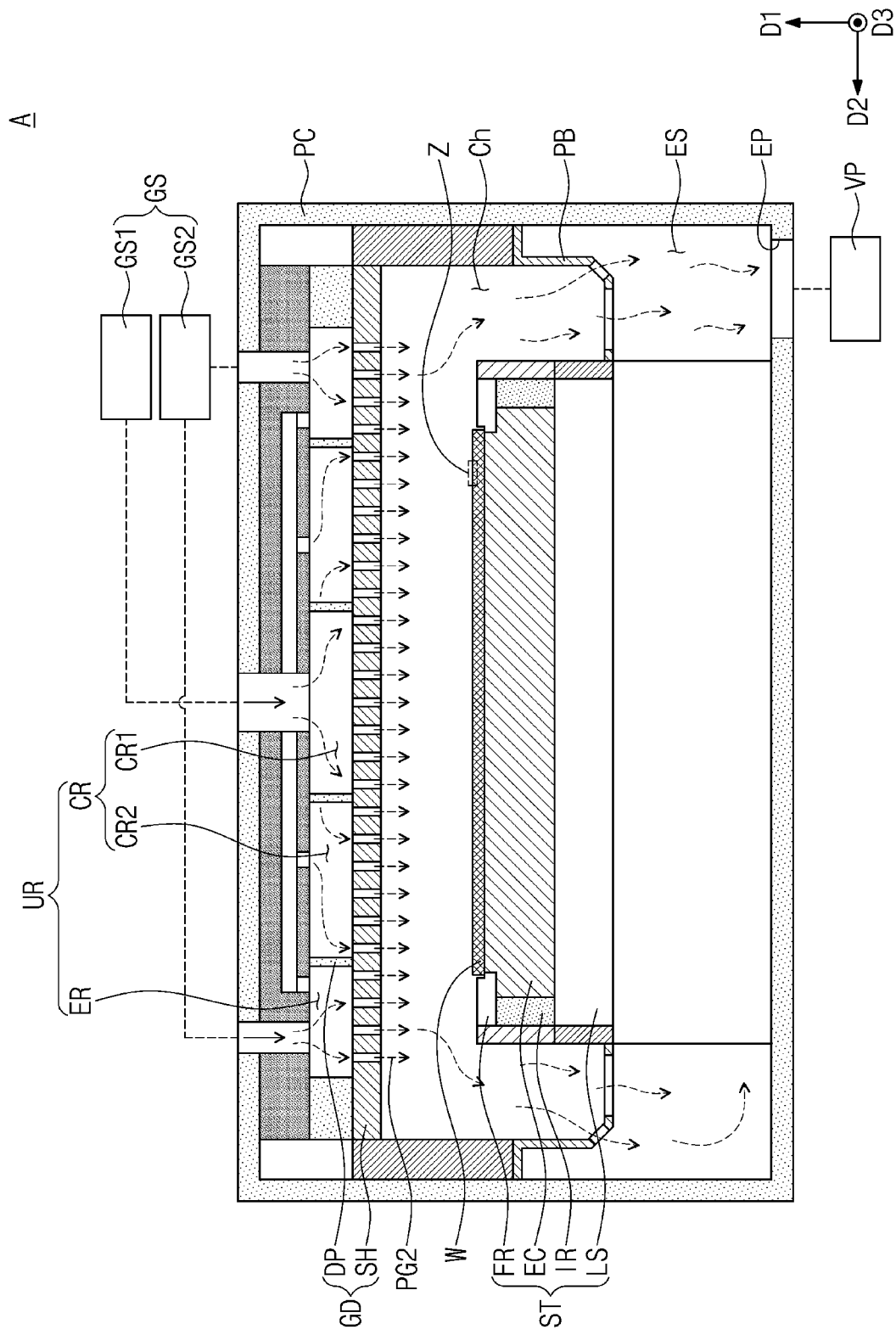
Figure 14:
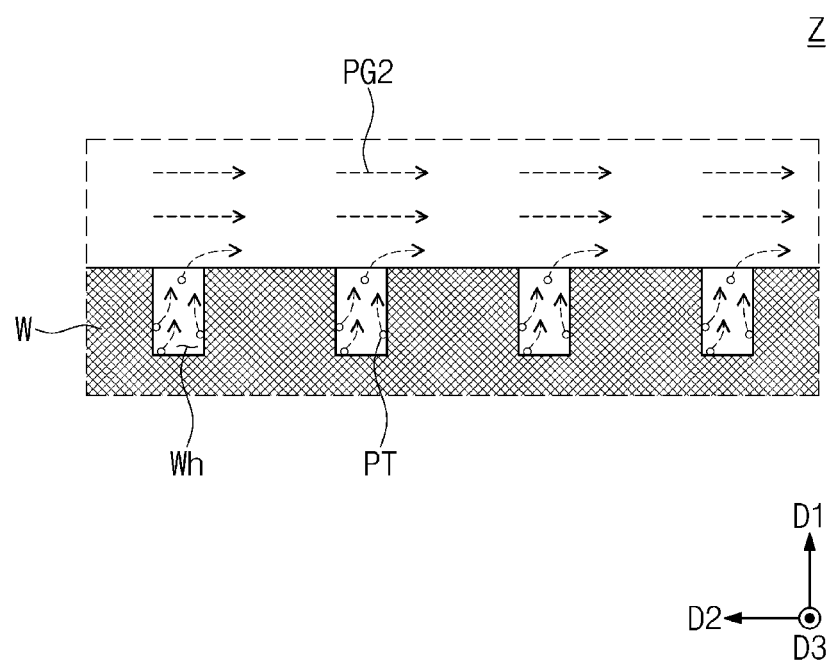

Referring to FIGS. 8, 13, and 14, the gas discharging step S3 may be performed after the etching process is completed or in the middle of the etching process. The gas discharging step S3 may include supplying the substrate processing apparatus A with a second process gas PG2. In some embodiments, the second process gas PG2 may be different from the first process gas PG1, but the present inventive concepts are not limited thereto. The gas discharging step S3 may further include allowing the second process gas PG2 to escape through the plasma baffle PB. In this step, foreign substances on the substrate W and/or in the process space Ch may be removed with the second process gas PG2 from the substrate W and/or from the process space Ch. For example, as illustrated in FIG. 14, the second process gas PG2 may remove foreign substances PT from etching holes Wh of the substrate W, while passing in a horizontal direction over a top surface of the substrate W. When the second process gas PG2 promptly passes in a horizontal direction over the top surface of the substrate W, there may be a large difference in static pressure between a floor of the etching hole Wh and a space on/above the top surface of the substrate W. Therefore, when the second process gas PG2 moves at high speeds, the foreign substance PT may outwardly escape from the etching hole Wh, e.g., because of the pressure difference between the etching hole Wh and a space on/above the top surface of the substrate W. The foreign substance PT outwardly escaped from the etching hole Wh may move with the second process gas PG2 toward outside and/or edges of the substrate W. The foreign substance PT together with the second process gas PG2 may outwardly move after passing through the plasma baffle (see PB of FIG. 13). The foreign substance PT on the substrate W may thus be removed.

Figure 15:
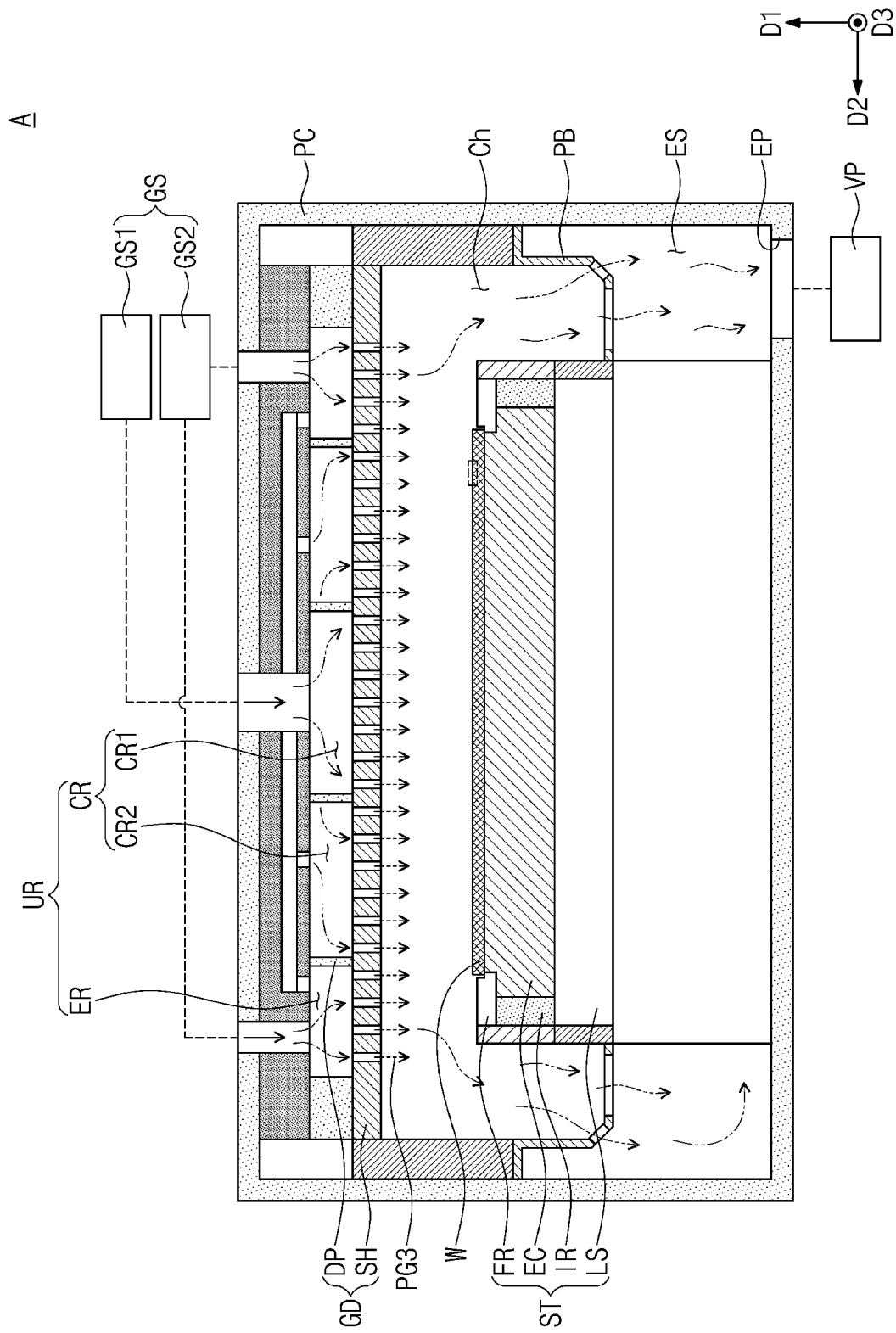

Referring to FIGS. 8 and 15, the deposition step S4 may include supplying the substrate processing apparatus A with a third process gas PG3. The third process gas PG3 supplied onto the substrate W may form a thin layer on the substrate W. For example, the third process gas PG3 may form a thin layer on a lateral surface of the etching hole Wh discussed with respect to FIG. 14. In this case, because the foreign substance (see PT of FIG. 14) has been removed from the etching hole Wh, a uniform deposition of the thin layer on the lateral surface of the etching hole Wh may be acquired/accomplished.

Afterwards, the etching step S2 may be performed. For example, after the deposition process is performed one time, the etching process may be executed again. The etching process and the deposition process may be alternately performed several/plural times.

Referring back to FIG. 8, the substrate unloading step S5 may include removing the substrate W form the chuck EC after repetition of the etching and deposition process is completed. Thereafter, the substrate W may be transferred for next process.

According to a plasma baffle, a substrate processing apparatus including the same, and a substrate processing method using the same in accordance with some embodiments of the present inventive concepts, an increase in length of slit in the plasma baffle may cause/induce an increase in discharging speed of fluid in the substrate processing apparatus. For example, an increase in length of slit may cause/effectuate an increase in area of the slit, and thus the fluid in the substrate processing apparatus may move at high speeds. When an area ratio of a plurality of lower slits to the lower ring is equal to or greater than about 59%, the fluid may be promptly discharged through the lower slits. Therefore, it may be possible to effectively remove foreign substances from a substrate. When the foreign substances are removed from the substrate, a following deposition process may be effectively performed.

According to a plasma baffle, a substrate processing apparatus including the same, and a substrate processing method using the same in accordance with some embodiments of the present inventive concepts, the degree of confinement of plasma at a lower slit may be controlled identical to the degree of confinement of plasma at an intermediate slit. The plasma may be limited not to pass through the plasma baffle at all positions in certain steps/conditions/situations, and therefore the plasma may be controlled uniformly. For example, the baffle and/or the substrate processing apparatus may be configured to close/open partially or fully the lower slits is and the intermediate slits 3s individually and/or by group so that the flow including the speed of flow of the process gases and/or the plasma is controlled.

According to a plasma baffle, a substrate processing apparatus including the same, and a substrate processing method using the same in accordance with some embodiments of the present inventive concepts, an intermediate slit may be disposed in an oblique direction, and this configuration may discharge fluid in the oblique direction. Therefore, the fluid may be prevented from being discharged after moving only in a horizontal direction on a substrate without passing on a top surface of the substrate on an edge region of the substrate. Thus, the fluid may be induced to pass while sweeping the edge region of the substrate. Accordingly, it may be possible to accomplish a uniform removal of foreign substances on the substrate. For example, the oblique intermediate slits is beneficial for a smooth flow of the process gases and the foreign substances when the process gases and the foreign substances are removed from the process space Ch. The smooth flow of the process gases and the foreign substances will be helpful for the foreign substances not to be stick on surfaces of the substrate processing apparatus, e.g., on an edge of the stage ST and/or on side surfaces of the process chamber PC.

Figure 16:
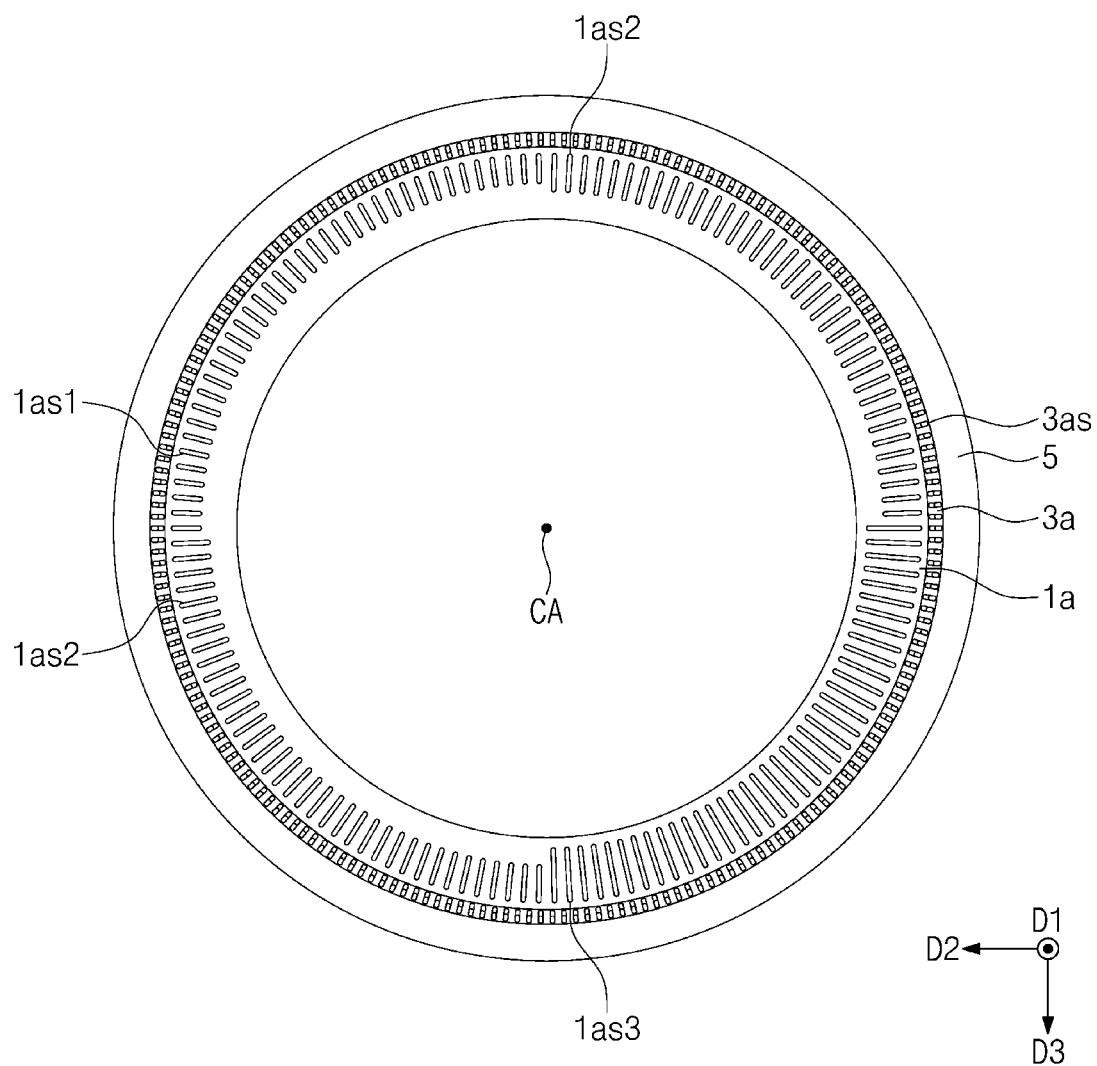
FIG. 16 illustrates a plan view showing a plasma baffle according to some embodiments of the present inventive concepts.

FIG. 16 illustrates a plan view showing a plasma baffle according to some embodiments of the present inventive concepts.

The following will omit a description of features substantially the same as or similar to those discussed with reference to FIGS. 1 to 15.

Referring to FIG. 16, a plasma baffle PBa may be provided. The plasma baffle PBa may include a lower ring 1a, an intermediate ring 3a, and an upper ring 5.

The lower ring 1a may provide a first lower slit 1as1, a second lower slit 1as1, and a third lower slit 1as3. The first, second, and third lower slits 1as1, 1as1, and a 1as3 may be disposed spaced apart from each other in a circumferential direction.

The first lower slit Iasi may have a first length, e.g., in a radial direction thereof. The second lower slit 1as2 may have a second length, e.g., in a radial direction thereof. The third lower slit 1as3 may have a third length, e.g., in a radial direction thereof. The first and second lengths may be different from each other. For example, the second length may be greater than the first length. In addition, the third length may be different from each of the first and second lengths. For example, the third length may be greater than the second length.

The intermediate ring 3a may provide an intermediate slit 3as, e.g., extending in a radial direction. A length in a radial direction of the intermediate slit 3as may be less than each of the first length, the second length, and the third length.

According to a plasma baffle, a substrate processing apparatus, and a substrate processing method in accordance with some embodiments of the present inventive concepts, a plurality of lower slits may have different lengths from each other. Therefore, a fluid may be controlled to have a movement speed distribution that is different along a circumferential direction. Accordingly, a variation of plasma may be controlled along the circumferential direction.

According to a plasma baffle, a substrate processing apparatus, and a substrate processing method in accordance with some embodiments of the present inventive concepts, it may be possible to remove foreign substances disposed/generated/occurring on a substrate during process.

According to a plasma baffle, a substrate processing apparatus, and a substrate processing method in accordance with some embodiments of the present inventive concepts, it may be possible to increase an etching yield with respect to the substrate.

According to a plasma baffle, a substrate processing apparatus, and a substrate processing method in accordance with some embodiments of the present inventive concepts, it may be possible to increase a movement speed of fluid while limiting the plasma within a preferred area.

According to a plasma baffle, a substrate processing apparatus, and a substrate processing method in accordance with some embodiments of the present inventive concepts, a speed of fluid may be independently controlled along the circumferential direction.

Effects of the present inventive concepts are not limited to the mentioned above, other effects which have not been mentioned above will be clearly understood to those skilled in the art from the whole description above.

Although the present inventive concepts have been described in connection with the embodiments of the present inventive concepts illustrated in the accompanying drawings, it will be understood to those skilled in the art that various changes and modifications may be made without departing from the technical spirit and essential feature of the present inventive concepts. It therefore will be understood that the embodiments described above are just illustrative but not limitative in all aspects.

What is claimed is:

1. A plasma baffle, comprising:
    a lower ring;
    an upper ring outside the lower ring in a plan view and extending vertically; and
    an intermediate ring that extends from the lower ring to the upper ring to form an acute angle with respect to a horizontal direction,
    wherein the lower ring includes:
        a lower central hole that vertically penetrates a center of the lower ring; and
        a plurality of lower slits outside the lower central hole and vertically penetrating the lower ring,
    wherein the intermediate ring provides an intermediate slit that connects an inner lateral surface of the intermediate ring to an outer lateral surface of the intermediate ring,
    wherein the plurality of lower slits and the intermediate slit are spaced apart from each other, and
    wherein an area ratio of the plurality of lower slits to the lower ring is equal to or greater than about 59%.

2. The plasma baffle of claim 1, wherein a ratio of length to width of the intermediate slit is in a range of about 3.5 to about 5.5, the length being measured in an extending direction of the intermediate ring, and the width being measured in a circumferential direction of the intermediate ring.

3. The plasma baffle of claim 1, wherein a width in a circumferential direction of the intermediate slit is the same as a width in the circumferential direction of each of the plurality of lower slits.

4. The plasma baffle of claim 1, wherein a ratio of length to width of each of the plurality of lower slits is in a range of about 9 to about 16, the length being measured in a radial direction, and the width being measured in a circumferential direction.

5. The plasma baffle of claim 1, wherein the intermediate ring includes a plurality of intermediate slits,
    wherein the plurality of intermediate slits are spaced apart from each other in the circumferential direction, and
    wherein the number of the plurality of intermediate slits is greater than the number of the plurality of lower slits.

6. The plasma baffle of claim 1, wherein a width in a circumferential direction of each of the plurality of lower slits is equal to or less than about 3 mm.

7. The plasma baffle of claim 1, wherein a thickness of the intermediate slit is the same as a thickness of each of the plurality of lower slits.

8. The plasma baffle of claim 1, wherein the plurality of lower slits include:
    a first lower slit; and
    a second lower slit spaced apart in a circumferential direction from the first lower slit,
    wherein a first length in a radial direction of the first lower slit is different from a second length in the radial direction of the second lower slit.

9. The plasma baffle of claim 1, wherein a ratio of width to thickness of each of the plurality of lower slits is the same as a ratio of width to thickness of the intermediate slit, the width of each of the lower and intermediate slits being measured in a circumferential direction.

10. The plasma baffle of claim 5, wherein the number of all of the plurality of intermediate slits is greater than the number of all of the plurality of lower slits.

11. The plasma baffle of claim 8, wherein a first full length in the radial direction of the first lower slit is different from a second full length in the radial direction of the second lower slit.

* * * * *